(12) United States Patent
Spires et al.

(10) Patent No.: US 6,169,425 B1
(45) Date of Patent: Jan. 2, 2001

(54) VOLTAGE SENSING CURRENT FOLDBACK SWITCH CIRCUIT

(75) Inventors: Dewayne Alan Spires, Plaistow, NH (US); Dean Michael Umberger, Stouchsburg, PA (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/162,662

(22) Filed: Sep. 29, 1998

(51) Int. Cl.[7] .................................................. G01R 19/00
(52) U.S. Cl. ................................... 327/56; 327/50; 327/51
(58) Field of Search ........................ 327/50, 51, 52, 327/53, 54, 55, 56, 63, 65, 67, 69, 70, 427, 430, 431, 432, 433, 434, 437

(56) References Cited

U.S. PATENT DOCUMENTS

| | | | |
|---|---|---|---|
| 4,873,453 | * 10/1989 | Schmerda et al. | 307/130 |
| 5,361,008 | * 11/1994 | Saijo | 327/427 |
| 5,376,831 | * 12/1994 | Chen | 327/379 |
| 5,396,117 | * 3/1995 | Housen et al. | 327/480 |
| 5,844,440 | * 12/1998 | Lenk et al. | 327/322 |

* cited by examiner

Primary Examiner—Timothy P. Callahan
Assistant Examiner—Hai L. Nguyen
(74) Attorney, Agent, or Firm—Schnader Harrison Segal & Lewis, LLP

(57) ABSTRACT

The present invention is directed to an integrated circuit comprising a voltage source and a voltage sensing circuit having a switch circuit for sensing a switch voltage and a switch current; a voltage comparison circuit connected to the switch circuit for comparing the switch voltage to a limiting voltage; and a current limiting circuit connected to the switch circuit and the voltage comparison circuit, which is capable of limiting the switch current when the switch voltage reaches or exceeds the limiting voltage. In a preferred embodiment of the invention the switch circuit is a bi-directional switch circuit and the voltage comparison circuit incorporates a series of Zener diodes, wherein the current limiting circuit is a current foldback circuit.

18 Claims, 3 Drawing Sheets

VOLTAGE SENSING CURRENT FOLDBACK SWITCH CIRCUIT

BACKGROUND OF THE INVENTION

1. Field of the Invention

The present invention is directed to a voltage sensing switch circuit, particularly to a voltage dependent current limiting circuit, and more particularly to a voltage dependent current limiter for sensing the voltage across the terminals of a bi-directional switch.

2. Description of the Prior Art

The solid-state switches of the prior art which are connected to Tip and Ring circuits in telecommunications applications have traditionally required an external protection device to limit the maximum switch voltage to less than the minimum breakdown voltage rating of the switch. This is due to the fact that the Tip and Ring pair is often exposed to high power fault conditions, such as lightning or a power cross.

In such systems, the current limiting aspect of the switch is typically set by an internal current sense resistor. In this way, the power dissipation of the entire integrated circuit is determined from this switch current limit and the protector clamp voltage of the external device. The current limit of these prior art switches is typically set above about 120 mA to avoid any interference with normal audio and ringing signals.

Because of wide variation in protector clamp voltages, and the need to prevent the clipping of ringing voltage above about 200 v, the current limiting switch is normally required to withstand over 300 v in both the ON and OFF states. Since the current through the circuit is not dependent on the switch voltage in such circuits, the output DMOS transistors in these prior art systems are sized to survive the peak power associated with both the internal switch current limit and the external maximum protector voltage. Thus, these switches are typically current-limited independent of the switch differential voltage, and the power dissipation of the circuit is determined as a function of the external protector clamp voltage.

These prior art switches have the significant disadvantage that they are very costly in terms of the silicon area needed. However, if the transistors are undersized to reduce the silicon area, then extremely high temperatures can be reached in the active regions of the device, greatly reducing the life of the switch and greatly increasing the possibility of damage to or failure of the switch itself. These high temperatures significantly degrade device performance and reliability.

Accordingly, an improved circuit is needed which is capable of protecting the switch circuit while simultaneously maintaining proper sizing of the transistors and reducing the cost of the circuit in terms of the silicon area needed.

SUMMARY OF THE INVENTION

To achieve this objective, the present invention is directed to an integrated circuit comprising a voltage source and a voltage sensing circuit having a switch circuit for sensing a switch voltage and a switch current; a voltage comparison circuit connected to the switch circuit for comparing the switch voltage to a limiting voltage; and a current limiting circuit connected to the switch circuit and the voltage comparison circuit, which is capable of limiting the switch current when the switch voltage reaches or exceeds the limiting voltage. In a preferred embodiment of the invention the switch circuit is a bi-directional switch circuit and the voltage comparison circuit incorporates a series of Zener diodes, wherein the current limiting circuit is a current foldback circuit.

DETAILED DESCRIPTION

The present invention will be understood more fully from the detailed description given below and from accompanying drawings of preferred embodiments of the invention, which, however, should not be taken to limit the invention to a specific embodiment, but are for explanation and understanding only.

Figure 1:
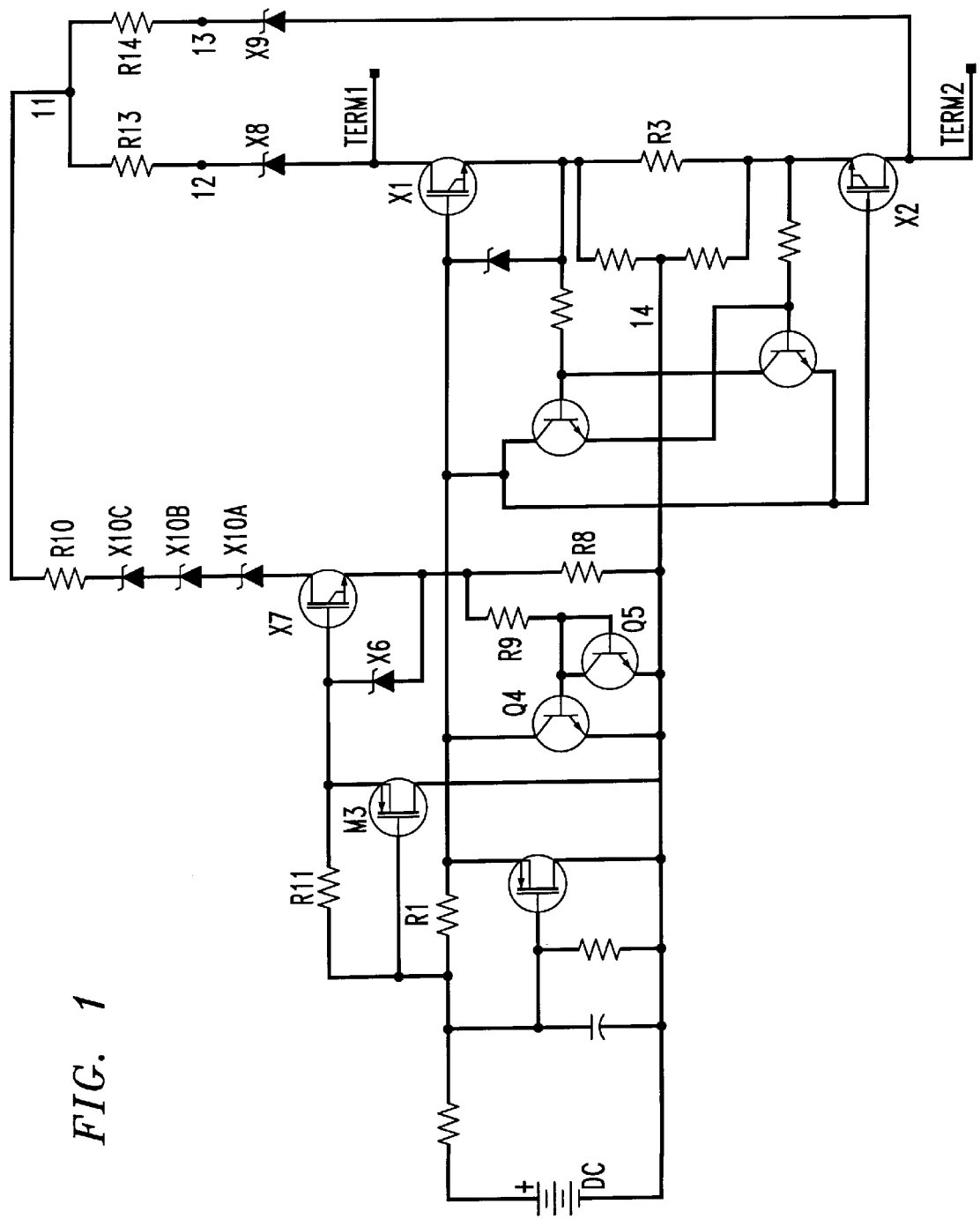
FIG. 1 is a schematic illustrating a preferred embodiment of the current limiting circuit of the present invention.

A schematic of a preferred embodiment of the present invention utilizing integrated circuit technology is shown in FIG. 1. As shown in FIG. 1, a series of Zener Diodes X10A–X10C are connected in a conventional manner through MOS Transistor M3, DMOS Transistor X7, Zener Diode X6, and Resistor R11. Of course, Zener Diodes X10A–X10C may comprise any number of diodes in order to achieve the appropriate breakdown voltage as described in more detail below. The voltage at TERM1 and TERM2 is rectified by Zener Diodes X8 and X9, and Resistors R13 and R14, and is passed through the foldback switch circuit formed by BJT Transistors Q4 and Q5.

The operation of the voltage sense circuit is described in more detail below in connection with the operation of the preferred embodiment of the invention shown in FIG. 1.

The preferred embodiment of the present invention shown in FIG. 1 operates in the following manner. When the switch shown in FIG. 1 is in the ON state, large output DMOS Transistors X1 and X2 and the smaller DMOS X7 in the sense paths are biased to an ON state with voltage applied from the gate contact to the source contact for each. Increasing the voltage across the Switch Terminals TERM1 and TERM2 causes DMOS Transistors X1 and X2 to limit the current through them as determined by Current Sense Resistor R3, in a manner well known to those of skill in the art.

Figure 2:
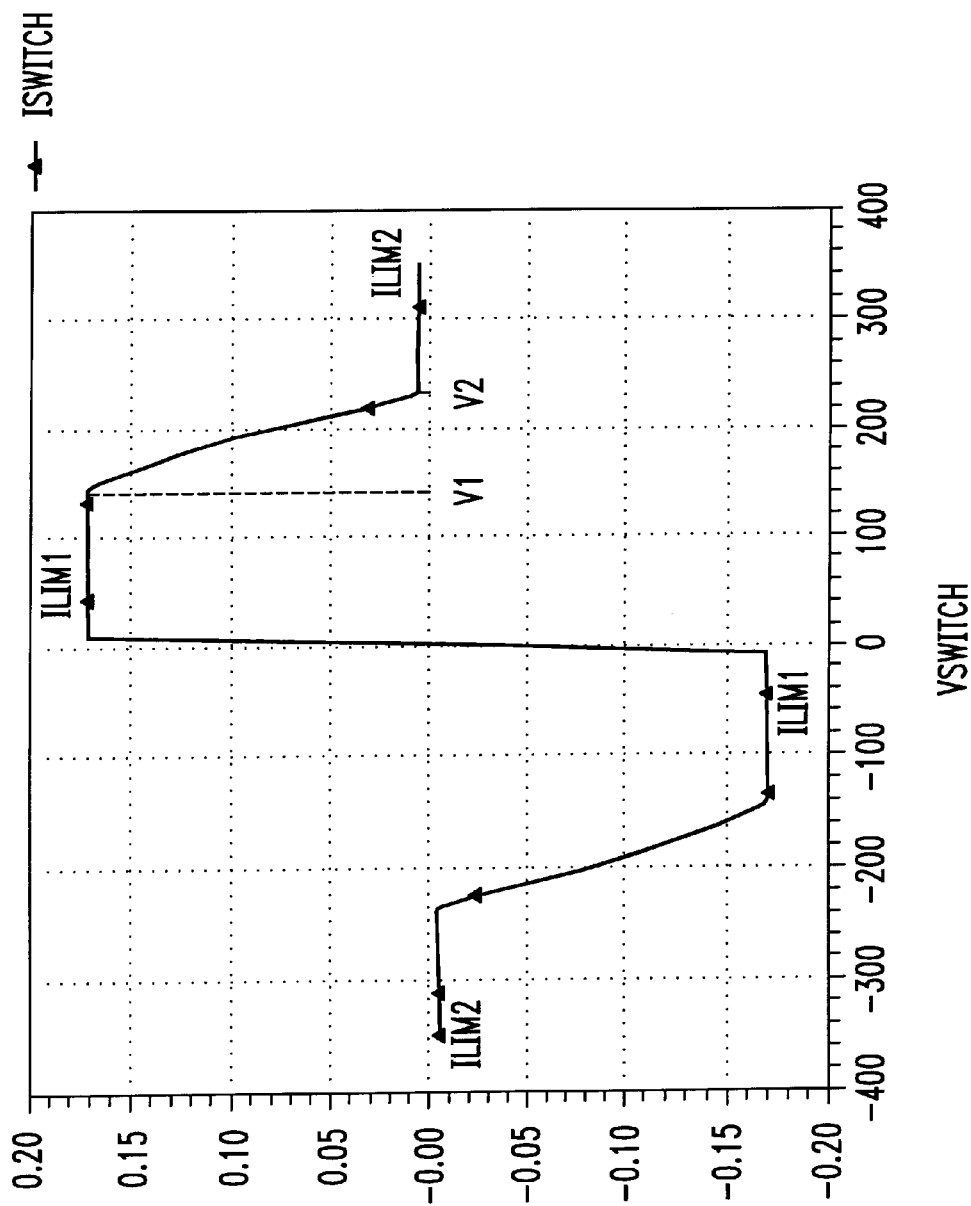
FIG. 2 is a chart illustrating the slope of the foldback characteristic of a switch developed in accordance with the embodiment of the invention illustrated in FIG. 1.

The current limit value of the DMOS Transistors X1 and X2 is shown as ILIM1 in FIG. 2. The increasing voltage across Switch Terminals TERM1 and TERM2 is rectified by Diodes X8 and X9 and appears at Nodes 11–14. The current limit of the switch shown in FIG. 1 remains at ILIM1 until the voltage at Switch Terminals exceeds the breakdown voltage of Zener Diodes X10A–X10C.

Once the voltage exceeds the breakdown voltage of Zener Diodes X10A–X10C, DMOS Transistor X7 begins to conduct. This causes current to flow through Resistor R8. As the voltage increases, Transistor Q4 discharges the gate to source voltage of output DMOS Transistors X1 and X2 at a rate determined by the values of Resistors R1, R8, R9, and R10.

This sets the slope of the foldback characteristic of the switch, which is shown in FIG. 2 as the rate of change of current between voltage breakpoints V1 and V2. When the switch voltage has increased to the point where DMOS Transistors X1 and X2 are in an OFF state, the switch shown in FIG. 1 delivers a lower current, shown in FIG. 2 as ILIM2, through DMOS Transistor X7. The voltage across DMOS Transistor X7 is reduced from the switch voltage by voltage provided by Zener Diodes X10A–X10C and the voltage drop across Resistor R10. This allows the switch shown in FIG. 1 to provide current at high voltages while allowing for a very low operating power in DMOS Transistor X7.

In this manner, the maximum possible power dissipation of output DMOS Transistors X1 and X2 is no longer determined by the external protector voltage. At the same time, the size of output DMOS Transistors X1 and X2 is also significantly reduced, resulting in substantial savings in the required silicon surface area.

Figure 3:
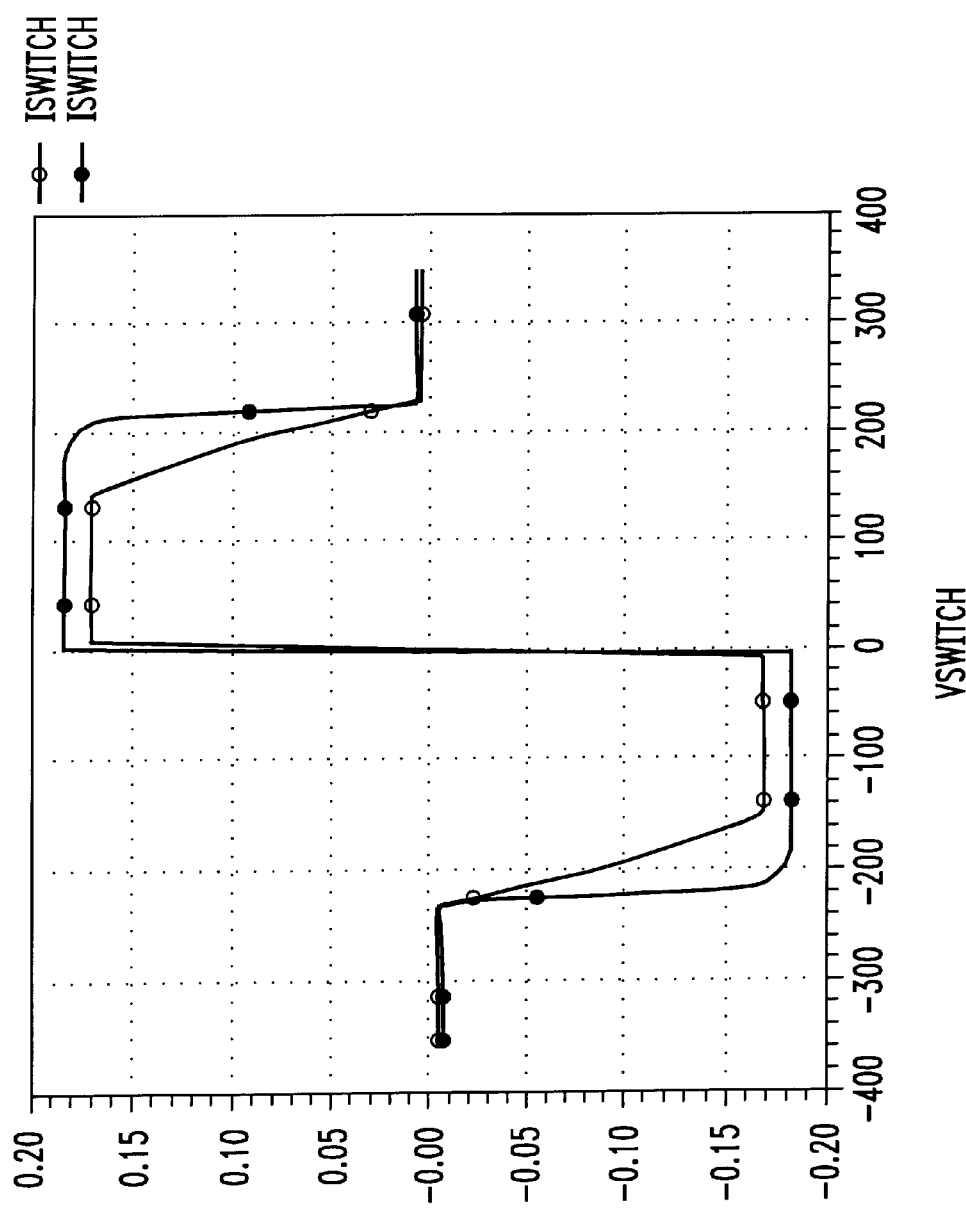
FIG. 3 is a chart illustrating a comparison of the V-I characteristics of two actual switches developed in accordance with the embodiment of the invention illustrated in FIG. 1.

A comparison of the V-I characteristics of two actual switches made in accordance with aspects of the present invention are shown in FIG. 3. The current limit ILIM1 of ISWITCH 2 increased by decreasing the value of Resistor R3 shown in the embodiment of the present invention shown in FIG. 1. Additionally, the voltage breakpoint V1 increased because of a higher breakdown voltage in Zener Diodes X10A–X10C. The rate at which the current changes between breakpoints V1 and V2 was increased by adjusting the values of Resistors R1, R8, R9, and R10 of the embodiment shown in FIG. 1.

The current limiting voltage sense circuit of the present invention has many applications in systems where it is necessary to handle very high power by sensing voltages and limiting power without interfering with signals, such as switches for telecommunications systems, and any high voltage switching application.

The present invention is applicable not only where reasonable voltages occur during normal operating conditions, but also higher power situations, such as in telecommunication systems utilizing more than 200 volts at 100 mA, i.e., 20 watts, during ringing.

Contrary to the systems of the prior, which have only been able to absorb the higher voltages in these systems, the present invention provides the significant advantage of being able to also limit current during these high power conditions. This results in a greatly improved large power dissipation. The present invention results in very low signal interference. The present invention also significantly limits overheating of semiconductor components, significantly improving absorption of fault currents and greatly reducing degradation of the integrated circuit.

While this invention has been described in conjunction with specific embodiments thereof, it is evident that many alternatives, modifications, and variations will be apparent to those skilled in the art. Accordingly, the preferred embodiments of the invention set forth herein are intended to be illustrative, not limiting. Various changes may be made without departing from the spirit and scope of the invention as defined in the appended claims.

What is claimed is:

1. An integrated circuit comprising:
   a voltage source;
   a voltage sensing circuit comprising:
   (a) a switch circuit for sensing a switch voltage and a switch current;
   (b) a voltage comparison circuit connected to said switch circuit for comparing said switch voltage to a limiting voltage wherein said voltage comparison circuit incorporates at least one Zener diode; and
   (c) a current limiting circuit connected to said switch circuit and said voltage comparison circuit capable of limiting said switch current when said switch voltage reaches or exceeds said limiting voltage.

2. The integrated circuit of claim 1, wherein said switch circuit is a bi-directional switch circuit.

3. The integrated circuit of claim 1, wherein said voltage comparison circuit incorporates a series of Zener diodes.

4. The integrated circuit of claim 1, wherein said current limiting circuit is a current foldback circuit.

5. The integrated circuit of claim 1, wherein said switch circuit, said voltage comparison circuit, and said current foldback circuit comprise a series of Zener Diodes, a plurality of DMOS transistors, and a plurality of BJT transistors.

6. In a method of sensing voltage in a switch having a switch voltage and a switch current, the method comprising the steps of:
   (a) determining a limiting voltage for said switch using at least one Zener diode;
   (b) determining a current limit for said switch;
   (c) sensing said switch voltage;
   (d) comparing said switch voltage to said limiting voltage; and
   (e) limiting said switch current to said current limit when said switch voltage reaches or exceeds said limiting voltage.

7. The method of claim 6, wherein said switch is a bi-directional switch.

8. The method of claim 6, wherein said switch is an integrated circuit.

9. The method of claim 6, wherein said limiting voltage is determined through the use of Zener diodes.

10. The method of claim 6, wherein said current limit is determined through the use of a current foldback circuit.

11. A voltage sensing circuit comprising:
   (a) a switch circuit for sensing a switch voltage and a switch current;
   (b) a voltage comparison circuit connected to said switch circuit for comparing said switch voltage to a limiting voltage wherein said voltage comparison circuit incorporates at least one Zener diode; and
   (c) a current limiting circuit connected to said switch circuit and said voltage comparison circuit capable of limiting said switch current when said switch voltage reaches or exceeds the limiting voltage.

12. The voltage sensing circuit of claim 11, wherein said switch is a bidirectional switch circuit.

13. The voltage sensing circuit of claim 11 wherein said voltage comparison circuit incorporates a series of Zener diodes.

14. The voltage sensing circuit of claim 11, wherein said current limiting circuit is a current foldback circuit.

15. The voltage sensing circuit of claim 11, wherein said switch circuit, said voltage comparison circuit, and said current foldback circuit comprise a series of Zener Diodes, a plurality of DMOS transistors, and a plurality of BJT transistors.

16. An integrated circuit comprising:
   a voltage source;
   a voltage sensing circuit comprising:
   (a) a bidirectional switch circuit for sensing a switch voltage and a switch current;
   (b) a voltage comparison circuit connected to said switch circuit for comparing said switch voltage to a limiting voltage; and
   (c) a current limiting circuit connected to said switch circuit and said voltage comparison circuit capable of limiting said switch current when said switch voltage reaches or exceeds said limiting voltage.

17. In a method of sensing voltage in a bidirectional switch having a switch voltage and a switch current, the method comprising the steps of:

(a) determining a limiting voltage for said switch;

(b) determining a current limit for said switch;

(c) sensing said switch voltage;

(d) comparing said switch voltage to said limiting voltage; and (e) limiting said switch current to said current limit when said switch voltage reaches or exceeds said limiting voltage.

18. A voltage sensing circuit comprising:

(a) a bidirectional switch circuit for sensing a switch voltage and a switch current;

(b) a voltage comparison circuit connected to said switch circuit for comparing said switch voltage to a limiting voltage; and (c) a current limiting circuit connected to said switch circuit and said voltage comparison circuit capable of limiting said switch current when said switch voltage reaches or exceeds the limiting voltage.

* * * * *